(12) United States Patent
Brotons et al.

(10) Patent No.: US 10,718,319 B2
(45) Date of Patent: Jul. 21, 2020

(54) ELECTRIC POWER SUPPLY SYSTEM FOR A HALL EFFECT ELECTRIC THRUSTER

(71) Applicant: AIRBUS DEFENCE AND SPACE SAS, Toulouse (FR)

(72) Inventors: Cyril Brotons, Toulouse (FR); Dimitry Loubere, Toulouse (FR); Guillaume Scremin, Toulouse (FR); Matthias Guilhem-Ducleon, Toulouse (FR)

(73) Assignee: AIRBUS DEFENCE AND SPACE SAS, Toulouse (FR)

( * ) Notice: Subject to any disclaimer, the term of this patent is extended or adjusted under 35 U.S.C. 154(b) by 0 days.

(21) Appl. No.: 16/315,144

(22) PCT Filed: Jul. 6, 2017

(86) PCT No.: PCT/EP2017/066980
§ 371 (c)(1),
(2) Date: Jan. 3, 2019

(87) PCT Pub. No.: WO2018/007545
PCT Pub. Date: Jan. 11, 2018

(65) Prior Publication Data
US 2019/0309736 A1    Oct. 10, 2019

(30) Foreign Application Priority Data

Jul. 7, 2016   (FR) ..................... 16 56532

(51) Int. Cl.
*F03H 1/00*      (2006.01)
*H03K 3/59*      (2006.01)

(52) U.S. Cl.
CPC ......... *F03H 1/0018* (2013.01); *F03H 1/0075* (2013.01); *H03K 3/59* (2013.01)

(58) Field of Classification Search
CPC ..... B64G 1/428; F03H 1/0018; F03H 1/0025; F03H 1/0062; F03H 1/0068; F03H 1/0075
See application file for complete search history.

(56) References Cited

U.S. PATENT DOCUMENTS

| 6,304,040 B1 | 10/2001 | Cardwell, Jr. et al. |
| 8,024,917 B2 | 9/2011 | Hruby et al. |
| 2002/0116915 A1* | 8/2002 | Hruby ................. F03H 1/0062 60/202 |

FOREIGN PATENT DOCUMENTS

CN    103 982 386 A    8/2014

OTHER PUBLICATIONS

Goebel, "Fundamentals of Electric Propulsion: Ion and Hall Thrusters" (Year: 2008).*

(Continued)

*Primary Examiner* — Gerald L Sung
*Assistant Examiner* — William L Breazeal
(74) *Attorney, Agent, or Firm* — Im IP Law; Chai Im; C. Andrew Im

(57) ABSTRACT

An electric power supply system for a Hall effect electric thruster. The Hall effect electric thruster includes an anode, a cathode, a heater for the cathode and an igniter. The electric power supply system includes a first power supply source to power the anode, a second power supply source to power the heater and a power supply unit to electrically supply the igniter. The power supply unit includes a third power supply source and a passive electric circuit. The third power supply source powers the passive electric circuit and is configured to generate a voltage in the form of at least one pulse.

3 Claims, 3 Drawing Sheets

(56) References Cited

OTHER PUBLICATIONS

Goebel et al., "Fundamentals of Electric Propulsion: Ion and Hall Thrusters," JPL Space Science and Technology Series, Mar. 2008.

* cited by examiner

ELECTRIC POWER SUPPLY SYSTEM FOR A HALL EFFECT ELECTRIC THRUSTER

RELATED APPLICATIONS

This application is a § 371 application of PCT/EP2017/066980 filed Jul. 6, 2017, which claims priority from French Patent Application No. 16 56532 filed Jul. 7, 2016, each of which is incorporated herein by reference in its entirety.

FIELD OF THE INVENTION

This invention belongs to the space propulsion domain. More specifically, this invention pertains to a Hall-effect electric thruster.

This invention mainly pertains to an electric power supply system for a Hall-effect electric thruster.

BACKGROUND OF THE INVENTION

The working of a Hall-effect electric thruster and the role of its various constituent elements, namely an anode, a cathode, a magnetic circuit, and a heater of the cathode, are properly known to the person skilled in the art. An example that may be cited is "*Fundamentals of Electric Propulsion: Ion and Hall Thrusters*", Dan M. Goebel and Ira Katz, *JPL Space Science and Technology Series*, March 2008. They are only briefly recalled here.

In a steady state, plasma forms at the anode and the cathode and the propulsion comes from the electrostatic acceleration generated by the positive ions. A propellant gas, usually xenon, is injected into the anode and collides with the electrons held there by a magnetic field and thereby renewing the plasma.

A conventional Hall-effect electric thruster is powered by an electric power supply system commonly referred to as the Power Processing Unit (PPU).

FIG. 1 illustrates a standard electric power supply system 1 of a Hall-effect electric thruster.

This electric power supply system typically consists of separate power supply sources to drive the different elements of the Hall-effect electric thruster.

In FIG. 1, the voltage sources are indicated by the symbol ± and the current intensity sources by the symbol ↑.

The electric power supply system 1 includes:
- a first power supply source 10 for supplying power to anode 50,
- a second power supply source 11 for supplying power to the heater 53 to heat the cathode 51, and to enable it to emit electrons, and
- a power supply unit 12 for supplying power to a component close to the emitting part of the cathode, called the igniter 52.

The first power supply source 10 is a direct, high-voltage source, and provides the major portion of the electric power required for the functioning of the Hall-effect electric thruster.

The second power supply source 11 is a current source.

The power supply unit 12 consists of a first unit, called the ignition module 121, combined and switchable with a second unit, called the support module 122. Generally speaking, the ignition module 121 includes a voltage square pulse generator, or a high voltage direct source, and the support module 122 includes a current source.

The first 10 and second 11 power supply sources and the power supply unit 12 are all together connected to the cathode 51 which is the voltage reference, usually known as the CRP (Cathode Reference Point).

A complex ignition process needs to be initialised to attain the steady state. \

The cathode 51 is preheated, usually for a few minutes, by the heater 53. Simultaneous to this heating phase, or following the same, voltage is applied between the igniter 52 and the cathode 51. A very weak electric current is established between the cathode 51 and the igniter 52 facilitated by the thermionic effect due to the heating of the cathode 51 by the heater 53. The voltage is applied until plasma is generated in cathode 51. For certain cathode technologies, high direct voltage in the range of 100 to 500 V is adequate. For other technologies, voltage is applied in the form of rectangular pulses, between 0 and 100-500 V, each, typically, lasting a few milliseconds at a frequency of ~10 Hz, which increases the reliability of the ignition during the entire service life of the Hall-effect electric thruster. Voltage in the form of rectangular pulses may possibly be combined with a direct voltage ranging between 50 and 150 V.

When the plasma is generated at the level of cathode 51, the electrical conductivity between the latter and the igniter 52 is significantly increased such that the intensity of the current circulating in the igniter 52 increases.

An electronic control sensor detects this increase in current and then cuts off the ignition module 121. It may also be contemplated that the electronic control sensor automatically cuts off the ignition module 121 after a predefined time period.

During a subsequent phase, called the support phase, the electronic control sensor applies a weaker voltage to the igniter 52, via the support module 122, in a pulsed or continuous form.

This support phase typically lasts until a discharge current appears between the anode 50 and the cathode 51 and creates plasma in anode 50. The Hall-effect electric thruster is then switched on.

The management of the power supply of the igniter 52 proves to be very complex (multiple sources of power, electronic control sensor, switching from one mode of operation to the other), which contributes to increase in the cost, volume and mass of the Hall-effect electric thruster and its power processing units (PPU). In addition, the number and complexity of electronic devices affect the reliability of said Hall-effect electric thruster, which necessitates oversizing and/or redundancies, thus raising the cost, volume and mass even more. In this regard, the PPU proves to be the most critical part of the electric propulsion.

U.S. Pat. No. 8,024,917, for example, proposes simplifying the PPU, at the level of the electric supply unit of the igniter, by using a multipurpose and common supply source, providing power supply to the heater, igniter, anode and possibly the control magnetic circuit of the plasma. A switch is configured to turn off the power supply to the heater through a first electronic device. When the switch is in the closed position, the common power supply source powers the heater, and no current flows through the other two circuits powering the anode and the igniter. Then, when a predefined criterion, for example a time period, a voltage, an intensity of current or a temperature, is verified, the first electronic device causes the switch to flip to the open position, which thereby cuts off the power supply to the heater. The voltage across the terminals of the igniter and the anode is thus equal to the voltage of the open circuit of the power supply, typically 300 V. The voltage is sufficient to cause a discharge current to appear in the space between the cathode and the igniter. The voltage between the cathode and the igniter then drops below the voltage at the terminals of the anode. A flow of electrons is created and flows from the cathode towards the anode, which is at a higher voltage, such that a discharge current is established between the cathode and the anode creating plasma. The electric thruster is thus switched on. The opening of a second switch enables a second electronic device to cut off the power supply to the igniter.

However, the power supply of the igniter remains very complex.

One can also cite U.S. Pat. No. 6,304,040 that describes an electric power supply system of a Hall-effect electric thruster. A voltage at the terminals of the igniter and the anode is generated in the form of pulses by means of a switch controlled by logic control, until the appearance of a discharge current in the space between the cathode and the igniter. The power supply system also proves to be complex and costly, particularly due to the use of an inductance.

OBJECT AND SUMMARY OF THE INVENTION

This invention aims to remedy all or a part of the limitations of the solutions offered by the prior art, particularly those disclosed hereinabove, by providing a simple and economical solution while guaranteeing the reliability of the ignition of the Hall-effect electric thruster.

To this effect, the invention pertains to an electric power supply system of a Hall-effect electric thruster, said Hall-effect electric thruster including an anode, cathode, a heater for the cathode and an igniter. The electric power supply system comprises:
 a first power supply source for powering the anode,
 a second power supply source for powering the heater, and
 a power supply unit for electrically powering the igniter.

According to the invention, the power supply unit comprises:
 a third power supply source,
 a passive electrical circuit, powered by said third power supply source, and configured so as to generate a voltage in the form of at least one pulse.

Such an electric power supply system provides for a simpler powering of the igniter by means of a passive electrical circuit comprising solely of the standard passive components.

The voltage generated, in the form of pulses, between the igniter and the cathode allows the reliability of the ignition of the Hall-effect electric thruster to be favourably improved.

According to preferred embodiments, the invention also has the following characteristics, implemented separately or in each of their technically effective combinations.

In particular embodiments, the voltage generated by the passive electrical circuit is less than or equal to a voltage provided by the third power supply source.

In particular embodiments, the passive electrical circuit is configured so as to generate a voltage in the form of a series of successive pulses. The passive electrical circuit generates successive pulses on its own, without external control.

The passive electrical circuit does not advantageously comprise an inductor, a component that is significantly heavy in comparison with other passive components, such as a resistor or a capacitor, and costly.

In particular embodiments, to further simplify the electric power supply system, the first and third power supply sources are one and the same power supply source.

In a particular embodiment, the voltage generated by the passive electrical circuit is less than or equal to a voltage provided by the first power supply source.

In particular embodiments, the passive electrical circuit includes a capacitor.

The charging and the discharging of the capacitor form an ascending edge and a descending edge respectively of a pulse.

The invention also pertains to a method to start up a Hall-effect electric thruster using an electric supply system in accordance with at least one of its embodiments. The method comprises the steps of:
 heating the cathode by the heater until a predetermined temperature required to enable the emission of electrons by said cathode,
 applying a voltage between the anode and the cathode,
 generating, by the passive electrical circuit, a voltage between the igniter and the cathode in the form of at least one pulse.

In particular modes of implementation, the passive electrical circuit generates a voltage less than or equal to a voltage provided by the third power supply source.

In particular modes of implementation, where the first and third power supply sources are the same power supply source, the passive electrical circuit generates a voltage less than or equal to the voltage provided by the first power supply source.

In particular modes of implementation, the passive electrical circuit is configured to generate a voltage in the form of a series of successive pulses until a discharge current appears between the anode and the cathode.

In particular modes of implementation, the heating of the cathode is discontinued after voltage is applied to the anode and before the powering on of the electric thruster, such that the maximum amplitude of the pulses increases with the decrease in the emission of electrons by the cathode. The switching off of the heating of the cathode prior to the powering on of the thruster also favourably allows using the power supply source, meant for the heating of the cathode, for another application.

DESCRIPTION OF THE FIGURES

The invention will be better understood after reading the following description, given as a non-limiting example, and made by referring to the figures below which represent.

Figure 1:
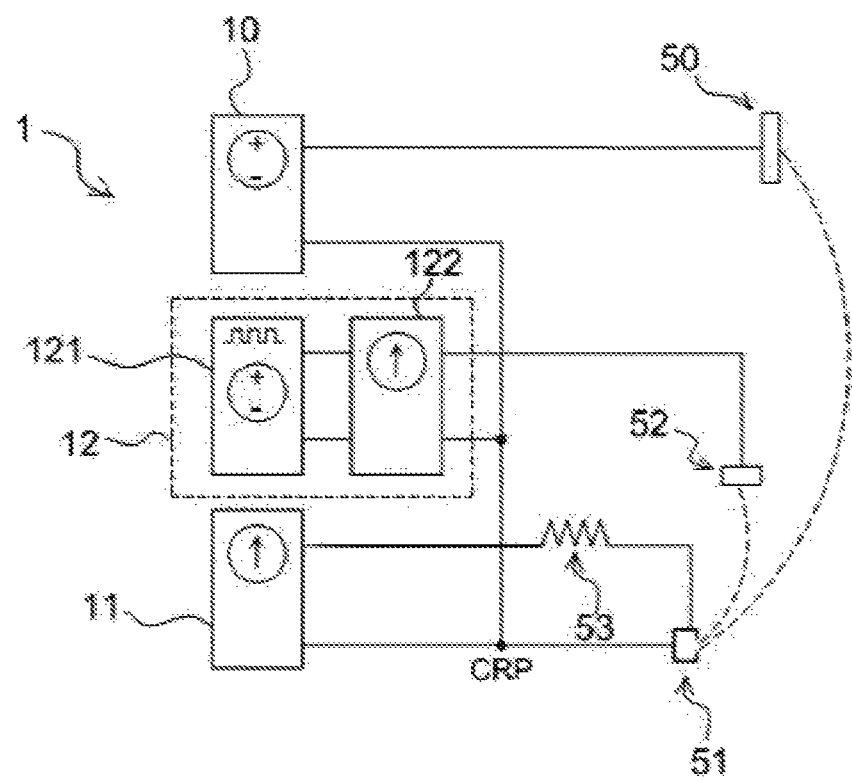
FIG. 1, already described, is an electric power supply system of a Hall-effect electric thruster according to the prior art.

In these figures, identical references from one figure to another denote the same or analogous elements. For reasons of clarity, the elements shown are not to scale, unless stated otherwise.

DETAILED DESCRIPTION OF AN EMBODIMENT OF THE INVENTION

This invention relates to an electric power supply system 1 of a Hall-effect electric thruster 1.

A Hall-effect thruster usually comprises, on the one hand, a discharge channel to which an anode 50 is connected and, on the other hand, a cathode assembly situated near the outlet of the discharge channel. The cathode assembly comprises a cathode 51 and a heater 53 situated close to the cathode 51 and meant to heat said cathode to allow it to emit electrons. A magnetic circuit surrounds the discharge channel and creates a radial magnetic field within the discharge channel. A propellant gas, e.g. xenon, is injected at the rear of the discharge channel and in the cathode. The propellant gas is ionised in the discharge channel by collision with the electrons emitted by cathode 51. The ionisation of the propellant gas generates plasma. The ions produced are accelerated and ejected at very high speed (15 to 25 km/s) by an axial electric field created between the anode and the cathode, so as to generate the thrust effect. The electric field is generated by the combination of the magnetic field and a difference in electrostatic potential between the anode and the cathode.

Figure 4:
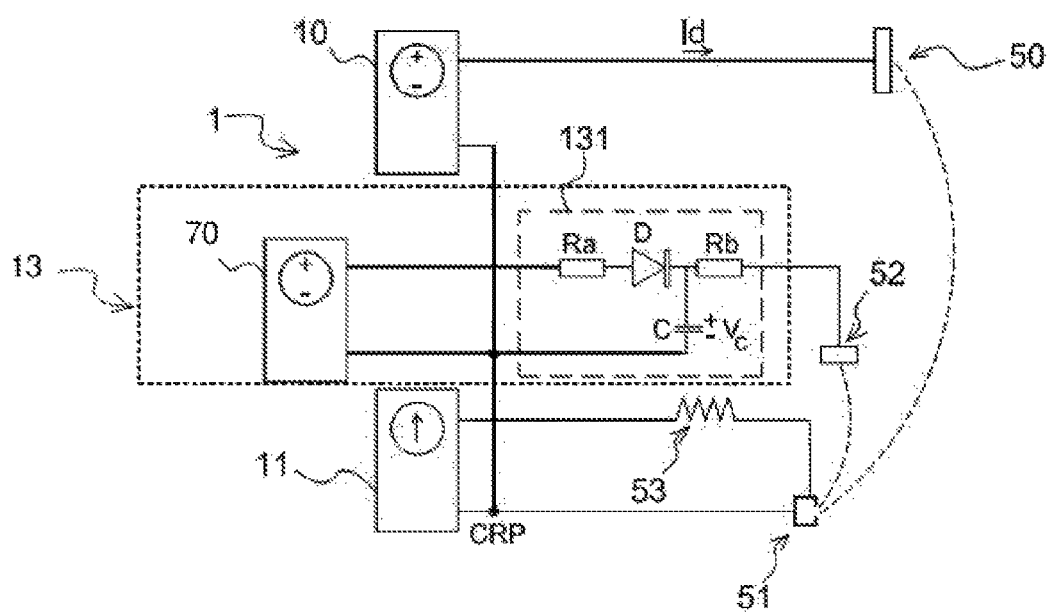
FIG. 4 is a variant of the electric power supply system of a Hall-effect electric thruster according to the invention.

FIG. 4 represents an electric power supply system 1 of the Hall-effect electric thruster, according to an embodiment of the invention.

The electric power supply system 1 includes a first power supply source 10 for electrically powering anode 50. Said first power supply source is for example a, preferably direct, high-voltage source. It provides a maximum voltage $V_{anode}$.

The electric power supply system 1 comprises a second power supply source 11 meant to electrically power the heater 53 to heat the cathode 51 and enable it to emit electrons. The second power supply source 11 is preferentially a current source.

The electric power supply source 1 has a power supply unit 13 to electrically power an igniter 52. Said power supply unit comprises an electric power supply source known as the third power supply source 70, and a passive electrical circuit 131. The third power supply source 70 is for example a, preferably direct, high-voltage source.

The passive electrical circuit 131 includes a first resistance $R_a$, connected directly to the third power supply source 70, assembled in series with a diode D and capacitor C. A second resistance $R_b$ is assembled between, on the one hand, the diode D and the capacitor C and, on the other hand, the igniter 52. The capacitor C is connected, at its other terminal, to the cathode reference point CRP.

The electric power supply system 1 can include a fourth power supply source to electrically power the magnetic circuit. The magnetic circuit and the fourth power supply source are not depicted in FIG. 4.

Figure 2:
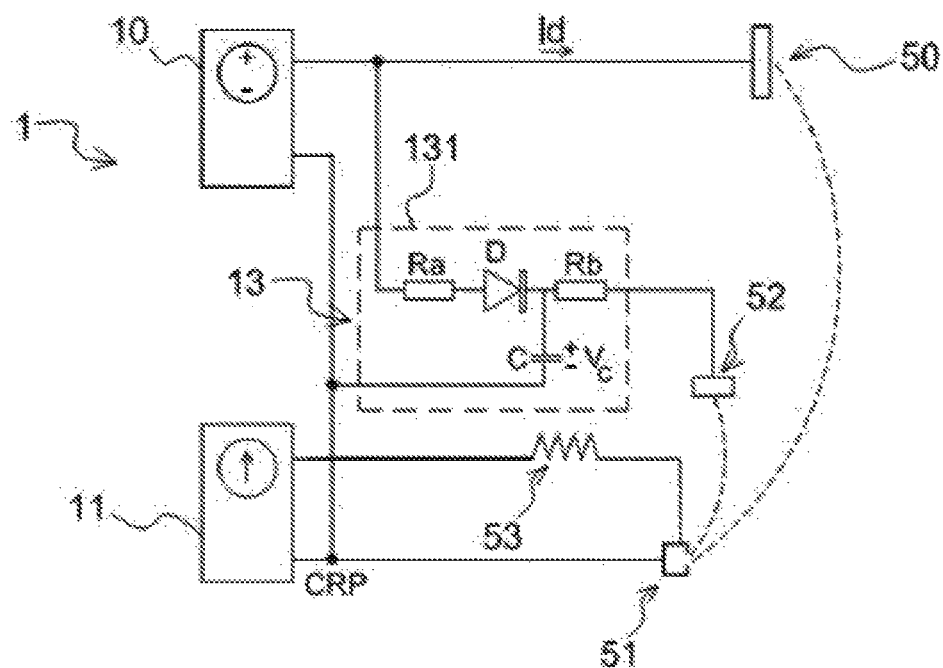
FIG. 2 is an example of electric power supply system of a Hall-effect electric thruster according to the invention.

In a preferred embodiment, and as illustrated in FIG. 2, for limiting the number of power supply sources, the first power supply source 10 and the third power supply source 70 are one and the same power supply source. Such an embodiment is preferred when, according to the type of electric thruster that is selected, the working voltage of the electric thruster is approximately equal to the voltage required to switch on said electric thruster. The passive electrical circuit 131 includes a first resistance $R_a$, connected directly, or through a switch, to the first power supply source 10 assembled in series with a diode D and a capacitor C. A second resistance $R_b$ is assembled between, on the one hand, diode D and capacitor C and, on the other hand, the igniter 52. The capacitor C is connected, at its other terminal, to the cathode reference point CRP.

The passive electrical circuit 131 is powered by the first power supply source 10, or the third power supply source as per the selected configuration of FIG. 2 or 4, and is configured to generate voltage in the form of at least one pulse as output.

The charging and the discharging of the capacitor C respectively form the ascending and descending edges of a pulse.

The functioning of such a circuit is presently explained in connection with the curve graphs depicted in FIGS. 3a and 3b, to allow for the start-up of the Hall-effect electric thruster.

Figure 3A:
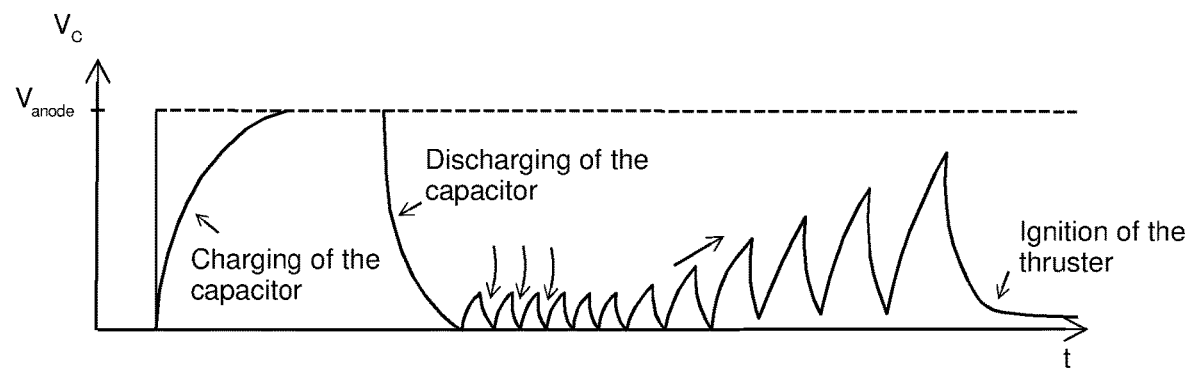
FIG. 3a is a curve graph illustrating a voltage signal at the terminals of the capacitor.

FIG. 3a illustrates the changes in the voltage signal $V_c$ at the terminals of the capacitor C over time.

Figure 3B:
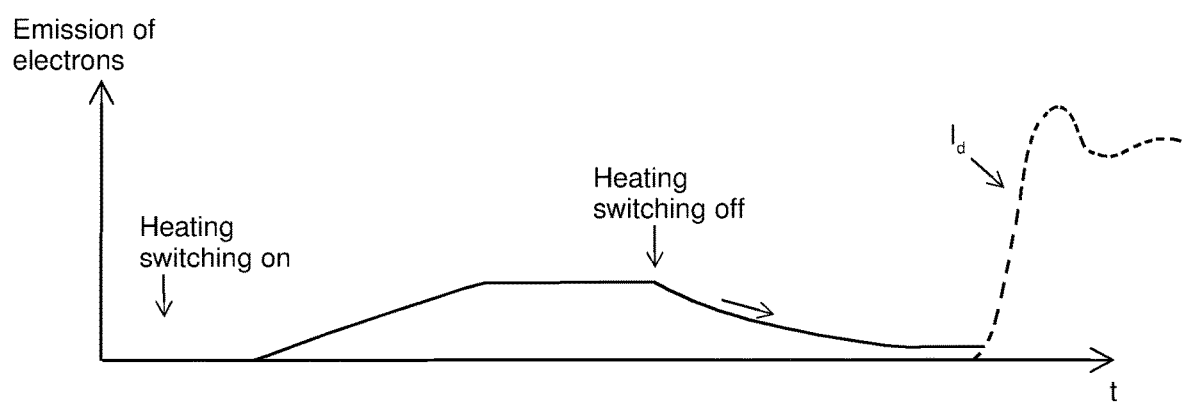
FIG. 3b is a curve graph illustrating the emission of electrons by the cathode and the discharge current.

FIG. 3b illustrates the changes in the emission of electrons by the cathode (solid line) and the discharge current (broken line) over time.

A first stage consists of the heating phase of the cathode 51.

During this heating phase, the cathode 51 is heated up to a predetermined temperature. The cathode 51 is heated by means of the heater 53 that is powered by the second power supply source 11.

The cathode 51 is heated until it reaches a temperature corresponding to the minimum temperature which enables cathode 51 to emit the volume of electrons required to establish a discharge current in the discharge channel which is adequate to ionise the atoms of the propellant gas in said discharge channel.

In an example of implementation, when the material of the cathode is lanthanum hexaboride (LaB6), the temperature is about 1,600° C.

In a second phase, a direct voltage is applied between the anode 50 and the cathode 51, through the first power supply source 10.

In the configuration where the first power supply source 10 is common between the anode 50 and the igniter 52, a voltage in the form of at least one pulse is applied between the igniter 52 and the cathode 51, through the first power supply source and the passive electrical circuit.

In the configuration where the first and the third power supply sources are separate, a voltage in the form of at least one at least one pulse is applied between the igniter 52 and the cathode 51, through the third power supply source and the passive electrical circuit.

This second phase is preferentially to be executed simultaneously with the first phase, but can be executed following the same without modifying the result of said phases.

At the same time as this second phase, a voltage is applied to the terminals of the magnetic circuit and a propellant gas is injected through the anode.

Once the capacitor C is powered by the first power supply source 10 or the third power supply source 70 according to the configuration of FIG. 2 or 4 used, said capacitor C is charged with a time constant $R_aC$ until a voltage is established at its terminals which is close to the voltage $V_{anode}$ of the anode. A steady electrical state is established until the cathode 51 attains an adequate level of electron emission.

At this point in time, a first discharge current appears between the igniter and the cathode, discharging the capacitor C.

As in the prior art, a discharge current appears when the voltage at the terminals of the igniter 52 is near the voltage at the terminals of the anode 50. In the invention, the presence of the capacitor C creates a delay in the generation of voltage at the terminals of igniter 52. This delay depends on the time constant of the circuit and thereby on the choice of the first resistance $R_a$ and the capacitor C.

Thereafter, a series of pulses is generated. Each pulse begins with a partial charge of the capacitor C, followed by a discharge of the same each time a discharge current appears between the igniter 52 and the cathode 51. The peak of each pulse is therefore significantly lower than the voltage $V_{anode}$, due to the premature discharging of the capacitor C.

The pulses, i.e., the charging/discharging of the capacitor, continue in succession until a discharge current $I_d$ appears between the anode 50 and the cathode 51. At this moment, plasma is established in anode 50, allowing for the Hall-effect electric thruster to be switched on.

The establishment of plasma in anode 50 may occur during any discharging of the capacitor, even during the first discharge.

In a preferred mode of implementation, to improve the reliability of the powering on of anode 50, it is preferred that the voltage at the terminals of the capacitor C, at the end of its charging, is sufficiently high so that the discharge energy of said capacitor is large enough and suitable to create a discharge current $I_d$ between the anode 50 and the cathode 51.

In an example of implementation, to accumulate more energy at the level of the capacitor C, the second power supply source 11 is discontinued so as to switch off the heating of cathode 51.

The stopping of the heating of cathode 51 leads to gradually reducing the emission of electrons by cathode 51 and consequently reducing the probability of a discharge current appearing between the igniter and the cathode at low voltage. Thus, the maximum amplitude of the pulses increases with the decrease in the emission of electrons by cathode 51. These maximum amplitude values increase until the energy released during the discharging of the capacitor is adequate to trigger a discharge current $I_d$ between the anode 50 and the cathode 51 which generates plasma at the level of the anode, allowing for the Hall-effect electric thruster to be switched on.

When there is plasma in the Hall-effect electric thruster, at the level of the anode and the cathode, the electric conductivity between the igniter and the cathode is very high. Resistance $R_a$ then allows limiting the current circulating from the first power supply source 10 or the third power supply source 70, according to the configuration of the FIG. 2 or 4 that is used, to the igniter 52. The capacitor C keeps a low voltage at these terminals, draining a weak current across the resistance $R_b$, with a negligible effect on the efficiency of the Hall-effect electric thruster. A device to cut off power supply to igniter 52 is therefore unnecessary as the effect on the engine efficiency is also negligible.

The diode D serves as additional protection to the anode and to the first electrical supply source in case of overvoltage at the level of the capacitor in relation to the anode.

The unit of the third or the first power supply source, according to the selected configuration, and the passive electrical circuit described hereinabove favourably replaces the ignition module and the support module which are part of the equipment of the Hall-effect electric thrusters in the present state of the art.

The dimensioning of the passive components $R_a$ $R_b$ and C is done by standard methods known to persons skilled in the art for astrionics, depending mainly on the characteristics of the Hall-effect electric thruster, especially the technology of the cathode emitter, its thermionic and thermal behaviour and characteristics of the powering of the anode such as the maximum permissible current. This also determines the maximum amplitudes of the pulses and the residual current in continuous operation after the Hall-effect electric thruster is switched on.

In an example of embodiment, let $R_a \gg R_b$ be chosen.

$R_a$ should preferably be sufficiently large to protect the first power supply source 10, or the third power supply source 70 according to the configuration of FIG. 2 or 4 that is selected, against a sudden surge in current to a very high level in the phase before the Hall-effect electric thruster is switched on and to have a weak residual current, at the terminals of the capacitor, after the Hall-effect electric thruster is switched on.

$R_b$ is preferably relatively low to enable a rapid discharging of the capacitor C during the switching on phase, before the Hall-effect electric thruster is switched on, which allows the transfer of more energy during this phase.

In the specific case of an SPT100 Hall-effect electric thruster, conclusive tests were carried out with the following values:

$R_a = \sim 200$ kilo-ohm; $R_b = \sim 100$ Ohm; $C = \sim 1$ μF.

After a heating phase of the cathode for around 160 s, voltage was applied to the anode (300 V). Simultaneously, the heating of the cathode was switched off. The first discharging between the cathode and the igniter was initiated after one second. The discharging at the level of the anode was initiated 15 seconds later, following the emission of pulses of increasing magnitude between the igniter and the cathode.

The invention claimed is:

1. An electric power supply system of a Hall-effect electric thruster, the Hall-effect electric thruster comprising an anode, a cathode, a heater for the cathode, and an igniter, the electric power supply system comprising:
    a first power supply source, a second power supply source and an entirely passive electrical circuit,
    wherein the anode is electrically connected to a first terminal of the first power supply source,
    wherein the entirely passive electrical circuit is electrically connected between the first terminal and a second terminal of the first power supply source,
    wherein the entirely passive electrical circuit provides an igniter voltage to the igniter less than a first power supply source voltage between the first terminal and the second terminal,
    wherein the igniter voltage is provided in the form of at least one pulse,
    wherein the igniter voltage generates a discharge current between the igniter and the cathode, and
    wherein the heater is electrically connected to the second power supply source.

2. The electric power supply system as claimed in claim 1, wherein the entirely passive electrical circuit is configured to generate the igniter voltage as a series of successive pulses.

3. The electric power supply system as claimed in claim 1, wherein the entirely passive electrical circuit comprises a capacitor.

* * * * *